US 8,415,235 B2

(12) United States Patent
Kawata et al.

(10) Patent No.: US 8,415,235 B2
(45) Date of Patent: Apr. 9, 2013

(54) ADHESIVE, ADHESIVE SHEET, AND PROCESS FOR PRODUCING ELECTRONIC COMPONENTS

(75) Inventors: Satoru Kawata, Shibukawa (JP);
Takeshi Saito, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/318,411

(22) PCT Filed: May 10, 2010

(86) PCT No.: PCT/JP2010/057861
§ 371 (c)(1),
(2), (4) Date: Nov. 1, 2011

(87) PCT Pub. No.: WO2010/131616
PCT Pub. Date: Nov. 18, 2010

(65) Prior Publication Data
US 2012/0052655 A1 Mar. 1, 2012

(30) Foreign Application Priority Data
May 12, 2009 (JP) ................................. 2009-115166

(51) Int. Cl.
*H01L 21/302* (2006.01)
(52) U.S. Cl.
USPC ............ 438/464; 257/E21.214; 257/E21.483; 257/E21.599; 428/343; 428/423.1; 428/355 AC
(58) Field of Classification Search ........... 257/E21.214, 257/E21.237, E21.483, E21.599; 428/343, 428/423.1, 355 AC; 438/458, 460, 464; 524/504
See application file for complete search history.

(56) References Cited

U.S. PATENT DOCUMENTS

| | | | | |
|---|---|---|---|---|
| 4,876,039 | A | * | 10/1989 | Lo et al. .................... 264/4.7 |
| 5,538,793 | A | * | 7/1996 | Inokuchi et al. ............ 428/407 |
| 2006/0204749 | A1 | | 9/2006 | Kita et al. |
| 2010/0248452 | A1 | | 9/2010 | Saito et al. |

FOREIGN PATENT DOCUMENTS

| | | |
|---|---|---|
| JP | 2001-207154 | 7/2001 |
| JP | 2006-049509 | 2/2006 |
| JP | 2007-246633 | 9/2007 |
| JP | 2008-001817 | 1/2008 |
| JP | 2008-124141 | 5/2008 |
| JP | 2008-001817 | * 10/2008 |
| WO | WO 2009/050785 | 4/2009 |

OTHER PUBLICATIONS

International Search Report issued in International Application No. PCT/JP2010/057861 on Jul. 27, 2010.

* cited by examiner

*Primary Examiner* — Asok K Sarkar
(74) *Attorney, Agent, or Firm* — Stein IP, LLC

(57) ABSTRACT

In a conventional adhesive sheet laminated with a die attachment film, the die attachment film sometimes drops off from the die chip at the time of pick-up after die chip formation by dicing a wafer. The present invention provides an adhesive including a (meth)acrylate ester polymer, a urethane acrylate oligomer having 4 or more vinyl groups, and silicone microparticles. Another aspect of the invention, provides a process for producing electronic components, the process including: a wafer-pasting step of pasting a wafer on a surface of a die attachment film of an adhesive sheet; a dicing step of dicing the wafer into die chips; and a pick-up step of peeling the die attachment film from the adhesive layer after the dicing step, and picking up the die chip together with the die attachment film.

3 Claims, 2 Drawing Sheets

ADHESIVE, ADHESIVE SHEET, AND PROCESS FOR PRODUCING ELECTRONIC COMPONENTS

CROSS-REFERENCE TO RELATED APPLICATIONS

This application is a National Phase of PCT International Patent Application No. PCT/JP2010/057861, filed May 10, 2010, and Japanese Patent Application No. 2009-115166, filed May 12, 2009 in the Japanese Patent Office, the disclosures of which are incorporated herein by reference.

BACKGROUND OF THE INVENTION

1. Field of the Invention

The present invention relates to adhesives, adhesive sheets using the adhesive, and processes for producing electronic components. The present invention relates to, in particular, an adhesive and adhesive sheet used for dicing a wafer, and a process for producing electronic components based on the wafer.

2. Description of the Related Art

Patent Documents 1 to 3 disclose adhesive sheets which are used at the time of producing electronic components by dicing a wafer. When the adhesive sheets are laminated with die attachment films, the resultant adhesive sheets have a function of an adhesive sheet for dicing and a function of a bond to fix a chip on a lead frame, etc. By laminating the adhesive sheets with the die attachment films, a bond coating step after the dicing is omitted.

Prior Art Reference
Patent Document
    Patent Document 1: JP2006-049509A
    Patent Document 2: JP2007-246633A
    Patent Document 3: JP2008-001817A

SUMMARY OF THE INVENTION

Unfortunately, conventional adhesive sheets sometimes cause difficulty in chip pick-up operation following dicing when semiconductor components which have a large chip size and are thin are used as a target, with the semiconductor components becoming highly integrated. Furthermore, as for an adhesive sheet in which a die attachment film has been laminated, at the time of picking up a wafer after die chip formation by dicing, the die attachment film has sometimes dropped off from the die chip.

The present invention has been invented in view of such a situation, and provides an adhesive having superiority in a chip pick-up efficiency and preventing a die attachment film from dropping off a die chip.

The present invention provides an adhesive including: a (meth)acrylate ester polymer; a urethane acrylate oligomer having 4 or more vinyl groups; and silicone microparticles.

This adhesive can be preferably used for a material of an adhesive layer in a die attachment film (hereinafter, referred to as "DAF") all-in-one adhesive sheet which includes, on a substrate, the adhesive layer and a DAF. Use of an adhesive sheet having an adhesive layer made of this adhesive can make peeling of the DAF from the adhesive layer easier at the time of picking up chips after dicing. This can suppress chip pick-up defects. In addition, it can also prevent the DAF from dropping off the chip. Furthermore, the adhesive is excellent in chip retention during dicing, and achieves less contamination of the DAF caused by a residual micro-glue.

Hereinafter, various embodiments of the present invention are exemplified. The various embodiments as illustrated below can be combined with one another.

The content of the silicone microparticles is preferably between 0.05 parts by mass and 150 parts by mass per 100 parts by mass of the (meth)acrylate ester polymer. In this case, the chip pick-up efficiency is particularly superior, and the DAF is less likely to drop off from a wafer, in particular.

The content of the urethane acrylate oligomer is preferably between 15 parts by mass and 225 parts by mass per 100 parts by mass of the (meth)acrylate ester polymer. In this case, the chip pick-up efficiency is particularly superior, and the DAF is less likely to drop off from a wafer, in particular.

The content of the silicone microparticles may be between 0.1 parts by mass and 100 parts by mass per 100 parts by mass of the (meth)acrylate ester polymer Also, the content of the urethane acrylate oligomer may be between 20 parts by mass and 200 parts by mass per 100 parts by mass of the (meth)acrylate ester polymer.

The silicone microparticles preferably have silicone rubber spherical microparticles coated with a polyorganosilsesquioxane resin. In this case, the DAF is less likely to drop off from a wafer, in particular.

It is preferable to further incorporate a silicone graft polymer. In this case, the chip pick-up efficiency is particularly superior, and the DAF is less likely to drop off from a wafer, in particular.

The content of the silicone graft polymer is preferably between 0.05 parts by mass and 12.5 parts by mass per 100 parts by mass of the (meth)acrylate ester polymer. In this case, the chip pick-up efficiency is particularly superior, and the DAF is less likely to drop off from a wafer, in particular.

The present invention also provides an adhesive sheet including a substrate film and an adhesive layer having the above-described adhesive coated on the substrate film. This adhesive sheet is excellent in the chip pick-up efficiency, and the DAF is less likely to drop off from a wafer. In addition, this adhesive sheet is suitable for fixing electronic components. In addition, it is preferable that the DAF is laminated on the above adhesive layer.

Further, the present invention also provides a process for producing electronic components, the process including: a wafer-pasting step of pasting a wafer on a surface of a DAF of the above-described adhesive sheet; a dicing step of dicing the wafer pasted on the adhesive sheet into die chips; and a pick-up step of peeling the DAF from the adhesive layer after the dicing step, and picking up the die chip together with the DAF. Furthermore, the present invention provides a process for producing electronic components, the process including: a coating step of coating a whole wafer backside with a paste bond; a semi-curing step of heating the paste bond and causing the bond to be semi-cured like a sheet to form a bond semi-cured layer; an adhesive-sheet-pasting step of pasting the bond semi-cured layer on an adhesive layer of the above-described adhesive sheet; a dicing step of dicing the wafer into die chips after the adhesive-sheet-pasting step; and a pick-up step of peeling the bond semi-cured layer from the adhesive layer after the dicing step, and picking up the die chip including the bond semi-cured layer.

According to the present invention, even if the chip becomes larger in size and thinner, the chip pick-up efficiency after dicing is excellent. Furthermore, when the adhesive sheet is laminated with a DAF, the DAF fails to drop off from a die chip at the time of pick-up after die chip formation by dicing a wafer.

BRIEF DESCRIPTION OF THE DRAWINGS

These and/or other aspects and advantages of the invention will become apparent and more readily appreciated from the following description of the embodiments, taken in conjunction with the accompanying drawings of which.

DESCRIPTION OF SYMBOLS

| | |
|---|---|
| 1 | Adhesive layer |
| 2 | Substrate film |
| 3 | Adhesive sheet |
| 4 | DAF (die attachment film) |
| 5 | DAF all-in-one adhesive sheet |
| 6 | Silicon wafer |
| 7 | Ring frame |
| 8 | Dicing blade |
| 9 | Cutting |
| 10 | Die chip |
| 11 | Lead frame |

DETAILED DESCRIPTION OF THE EMBODIMENTS

Hereinafter, embodiments of the present invention are described in detail by using FIGS. 1 to 4. Throughout FIG. 1 to FIG. 4, the identical symbols are given the same components.

<Description of Terms>

As used herein, a monomer means a structure of the monomer itself or a structure derived from the monomer. The "parts" and "%" herein refers to a mass standard unless otherwise described. The term "(meth)acrylate" herein is a generic term referring to a compound including the (meth) portion of the (meth)acrylate and a compound not including the (meth) portion. In addition, the term "(meth)acrylate" is a generic term including acrylate and methacrylate.

<Outline of Embodiments>

FIGS. 1 to 4 are diagrams showing an adhesive sheet and a process for producing electronic components of an embodiment of the present invention.

Figure 1:
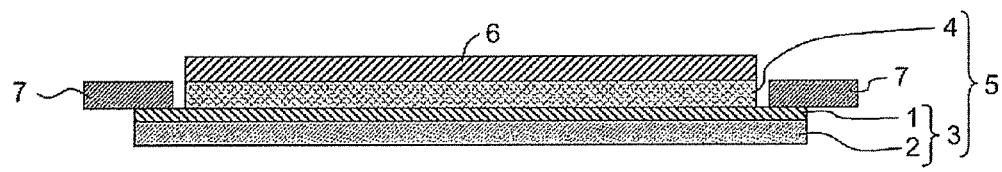
FIG. 1 is a schematic diagram showing an adhesive sheet and a process for producing electronic components of an embodiment of the present invention.
Figure 2:
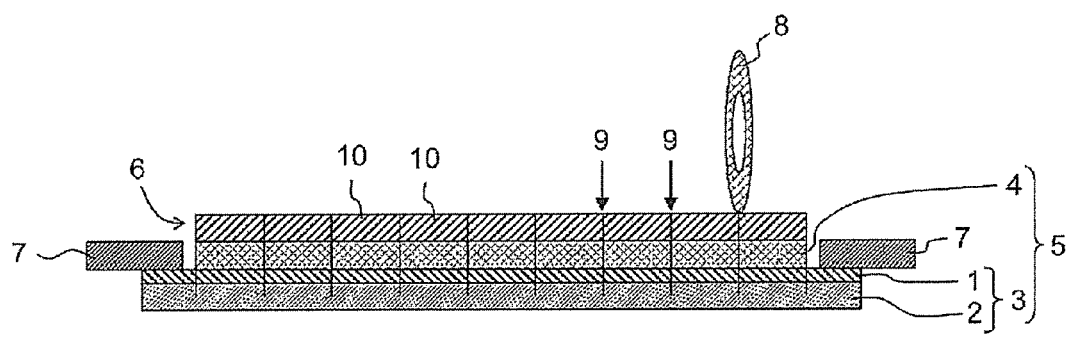
FIG. 2 is a schematic diagram showing a step following that of FIG. 1 and an adhesive sheet at that occasion.
Figure 3:
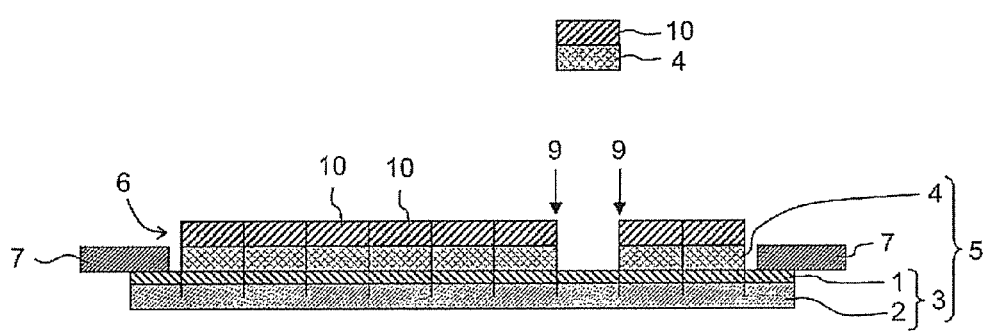
FIG. 3 is a schematic diagram showing a step following that of FIG. 2 and an adhesive sheet at that occasion.
Figure 4:
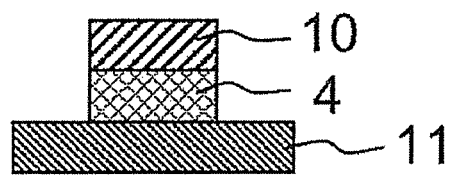
FIG. 4 is a schematic diagram showing a step following that of FIG. 3

As shown in FIG. 1, an adhesive sheet 3 of this embodiment has a substrate film 2 and an adhesive layer 1. A DAF (die attachment film) 4 is laminated on the adhesive layer 1. The adhesive sheet 3 and the DAF 4 form a DAF all-in-one adhesive sheet 5. A silicon wafer 6 is laminated on the DAF 4.

The adhesive layer 1 is produced by coating, on the substrate film 2, an adhesive including: a (meth)acrylate ester polymer; a urethane acrylate oligomer having 4 or more vinyl groups; and silicone microparticles.

The DAF all-in-one adhesive sheet 5 using the adhesive including this composition makes it easy to peel the DAF 4 from the adhesive layer 1 of the adhesive sheet 3 at the time of operation of picking up a die chip 10. In addition, the foregoing DAF all-in-one adhesive sheet 5 is excellent in chip retention, so that peeling (i.e., what is called "chip flying") of the die chip 10 can be suppressed during dicing.

In a process for producing electronic components by using the DAF all-in-one adhesive sheet 5, the die chip 10 can be picked up while keeping a state in which the DAF 4 has been attached to the backside of the die chip 10 after a silicon wafer 6 is diced. This process is followed by mounting the die chip 10 on a lead frame 11 as it is and by bonding them. At that time, the DAF 4 has less contamination due to a residual micro-glue and fails to drop off from the die chip 10. Thus, this can suppress occurrence of poor bonding.

Hereinafter, the detailed description will be given in the order of an adhesive, an adhesive sheet, and a process for producing electronic components.

<1. Adhesive>

First, an adhesive of an embodiment of the present invention is described. An adhesive of this embodiment contains a (meth)acrylate ester polymer, a urethane acrylate oligomer having 4 or more vinyl groups, and silicone microparticles. As an example, this adhesive contains 100 parts by mass of a (meth)acrylate ester polymer, 20 parts by mass to 200 parts by mass of a urethane acrylate oligomer having 4 or more vinyl groups, and 0.1 parts by mass to 100 parts by mass of silicone microparticles.

This adhesive may substantially contain only these three components. However, there may be added to the adhesive various known additives such as a curing agent, a tackifier resin, a polymerization initiator, a softening agent, an anti-oxidant, a filler, an antistatic agent, an ultraviolet absorber, and a photostabilizer. The adhesive preferably has the above three components as chief ingredients. The total content of the above three components combined in the adhesive is, for example, 50, 60, 70, 80, 90, 95, 99, or 100%. The total content of the above three components may be not less than any one value exemplified herein or may be between any two values.

<1-1. (Meth)Acrylate Ester Polymer>

A (meth)acrylate ester polymer is a polymer produced by polymerizing a (meth)acrylate ester monomer. In addition, the (meth)acrylate ester polymer may include a vinyl compound monomer other than the (meth)acrylate ester monomer. In addition, the (meth)acrylate ester monomer used for producing a (meth)acrylate ester polymer may employ one or two or more types of the monomer.

Examples of the (meth)acrylate ester monomer include butyl(meth)acrylate, 2-butyl (meth)acrylate, t-butyl(meth)acrylate, pentyl(meth)acrylate, octyl(meth)acrylate, 2-ethylhexyl (meth)acrylate, nonyl(meth)acrylate, decyl(meth)acrylate, lauryl(meth)acrylate, methyl (meth)acrylate, ethyl (meth)acrylate, isopropyl(meth)acrylate, tridecyl(meth)acrylate, myristyl (meth)acrylate, cetyl(meth)acrylate, stearyl(meth)acrylate, cyclohexyl(meth)acrylate, isobornyl (meth)acrylate, dicyclopentanyl(meth)acrylate, benzyl (meth)acrylate, methoxyethyl (meth)acrylate, ethoxyethyl (meth)acrylate, butoxymethyl(meth)acrylate, and ethoxy-n-propyl (meth)acrylate, 2-hydroxyethyl(meth)acrylate, 2-hydroxypropyl(meth)acrylate, and 2-hydroxybutyl(meth)acrylate. Among them, inclusion of butyl(meth)acrylate and ethyl (meth)acrylate is preferable because a sufficient initial adhesive strength of the adhesive can be achieved to ensure fixing of the adhesive sheet on the ring frame 11. This (meth)acrylate ester monomer preferably has a hydroxyl group. This is because the hydroxyl group can homogenize the adhesive and, in addition, can inhibit occurrence of contamination due to a silicone graft polymer by reacting the hydroxyl group with at least one isocyanate group present in a reaction residue of the urethane acrylate oligomer or with an isocyanate group present in an isocyanate-curing agent.

The vinyl compound monomer can preferably have one or more functional groups selected from the group consisting of hydroxyl, carboxyl, epoxy, amide, amino, methylol, sulfonate, sulfamate, and (phosphite)phosphoester.

The vinyl compound monomer having a hydroxyl group may, for example, be vinyl alcohol. Examples of the vinyl compound monomer having a carboxyl group include (meth) acrylic acid, crotonic acid, maleic acid, anhydrous maleic acid, itaconic acid, fumaric acid, acrylamide-N-glycolic acid, and cinnamic acid. Examples of the vinyl compound monomer having an epoxy group include allyl glycidyl ether and (meth)acrylate glycidyl ether. Examples of the vinyl compound monomer having an amide group include (meth)acrylamide. Examples of the vinyl compound monomer having an amino group include N,N-dimethylaminoethyl (meth)acrylate. Examples of the vinyl compound monomer having a methylol group include N-methylol acrylamide.

The weight average molecular weight (Mw) of the (meth) acrylate ester polymer is preferably, but not particularly limited to between 200 thousand and 2.5 million. This is because in such a case the adhesive properties are particularly preferable. The number average molecular weight of the polymer is, for example, 200 thousand, 400 thousand, 600 thousand, 800 thousand, 1 million, 1.5 million, 2 million, or 2.5 million. This weight average molecular weight may be between any two values exemplified herein.

A process for producing a (meth)acrylate ester polymer can use emulsion polymerization, solution polymerization, or the like. An acrylic rubber which can be produced by emulsion polymerization is preferable, so that the die attachment film 4 can be easily peeled from the adhesive sheet 3 after irradiation.

The (meth)acrylate ester polymer is preferably obtained by emulsion polymerization and is a copolymer containing components in the following proportion: in particular, 35 to 75% by mass of ethyl acrylate, 10 to 30% by mass of butyl acrylate, and 15 to 35% by mass of methoxyethyl acrylate when the ethyl acrylate, the butyl acrylate, and the methoxyethyl acrylate have a total of 100% by mass. This is because the adhesive sheet 3 has a sufficient initial adhesive strength, which can ensure fixing of the adhesive sheet 3 on the ring frame 11.

<1-2. Urethane Acrylate Oligomer>

A urethane acrylate oligomer having 4 or more vinyl groups (hereinafter, simply referred to as the "urethane acrylate oligomer") is not particularly limited if the (meth)acrylate oligomer has 4 or more vinyl groups and a urethane linkage within the molecule.

When the urethane acrylate oligomer has the number of vinyl groups of less than 4, the adhesive layer 1 may not be easily peeled from the die attachment film 4 after irradiation, thereby decreasing the efficiency of picking up the die chip 10. Meanwhile, the upper limit of the number of vinyl groups in the urethane acrylate oligomer is preferably, but not particularly limited to, up to about 15 in view of the availability and manufacturing cost, etc. The number of vinyl groups may, for example, be 4, 6, 9, 10, 15, 20, or 25. The number of vinyl groups may be not less than any one value exemplified herein or may be between any two values.

The weight average molecular weight (Mw) of the urethane acrylate oligomer is preferably, but not particularly limited to, between 1000 and 20000. This is because in such a case the adhesive properties are particularly preferable. The number average molecular weight of the oligomer may, for example, be 1000, 2000, 3000, 4000, 5000, 6000, 8000, 10000, 15000, or 20000. This weight average molecular weight may be between any two values exemplified herein.

The formulation amount of the urethane acrylate oligomer is, but not particularly limited to, for example, between 5 parts by mass and 300 parts by mass per 100 parts by mass of the (meth)acrylate ester polymer, preferably between 15 parts by mass and 225 parts by mass, and more preferably between 20 parts by mass and 200 parts by mass. This formulation amount may, for example, be 5, 10, 15, 20, 50, 100, 150, 200, 250, or 300 parts by mass per 100 parts by mass of the (meth)acrylate ester polymer. This formulation amount may be between any two values exemplified herein. When the formulation amount of this urethane acrylate oligomer is too small, the die attachment film 4 is not easily peeled from the adhesive sheet 3 after irradiation with a UV-light and/or radiation. This may lead to occurrence of problems with the efficiency of picking up the die chip 10. In addition, when the formulation amount is excessive, pick-up defects may occur due to scraping of the glue during dicing, and a residual micro-glue derived from the reaction residue is generated. This may cause poor bonding at the time of heating when the die chip 10 attached to the die attachment film 4 is mounted on the lead frame 11.

Examples of a process for producing the urethane acrylate oligomer include, but are not particularly limited to, a process for producing a urethane acrylate oligomer by reacting a (meth)acrylate compound containing a hydroxyl group and a plurality of (meth)acrylate groups with a compound having a plurality of isocyanate groups (e.g., a diisocyanate compound). In addition, the urethane acrylate oligomer can be produced by excessively adding a compound having a plurality of isocyanate groups (e.g., a diisocyanate compound) to a polyol oligomer having a plurality of hydroxyl group termini, by reacting them to yield an oligomer having a plurality of isocyanate termini, and further by reacting the oligomer with a (meth)acrylate compound containing a hydroxyl group and a plurality of (meth)acrylate groups.

Examples of the (meth)acrylate compound containing a hydroxyl group and a plurality of (meth)acrylate groups include hydroxy propylated trimethylol propane triacrylate, pentaerythritol triacrylate, dipentaerythritol-dihydroxy-pentaacrylate, bis(pentaerythritol)-tetraacrylate, tetramethylolmethane-triacrylate, glycidol-diacrylate, and compounds in which a part or all of these acrylate groups have been substituted by methacrylate groups.

Examples of the isocyanate having a plurality of isocyanate groups include aromatic isocyanate, alicyclic isocyanate, and aliphatic isocyanate. Among the isocyanates having a plurality of isocyanate groups, aromatic isocyanate or alicyclic isocyanate is preferably used. Examples of the form of the isocyanate compound include a monomer, a dimer, and a timer. The timer is preferably used Examples of the aromatic diisocyanate include tolylene diisocyanate, 4,4-diphenylmethane diisocyanate, and xylylene diisocyanate. Examples of the alicyclic diisocyanate include isophorone diisocyanate and methylene bis(4-cyclohexylisocyanate). Examples of the aliphatic diisocyanate include hexamethylene diisocyanate and trimethyl hexamethylene diisocyanate.

Examples of the polyol oligomer having a plurality of hydroxyl group termini include poly(propylene oxide)diol, poly(propylene oxide)triol, copoly(ethylene oxide/propylene oxide)diol, poly(tetramethylene oxide)diol, ethoxylated bisphenol A, ethoxylated bisphenol S spiroglycol, caprolactone denatured diol, and carbonate diol.

<1-3. Silicone Microparticles>

A silicone microparticle refers to a microparticle including a compound (i.e., a silicone) having a siloxane linkage (—SiO—) in its backbone. Examples include a spherical microparticle containing polyorganosiloxane or polyorganosilsesquioxane.

The formulation amount of the silicone microparticles is, but not particularly limited to, for example, between 0.01 parts by mass and 200 parts by mass per 100 parts by mass of the (meth)acrylate ester polymer, preferably between 0.05 parts by mass and 150 parts by mass, and more preferably between 0.1 parts by mass and 100 parts by mass. When the formulation amount of the silicone microparticles is too small, the die attachment film 4 is not easily peeled from the adhesive sheet 3 after irradiation with a UV-light and/or radiation. This may lead to occurrence of problems with the efficiency of picking up the die chip 10. Furthermore, even if the pick-up can be succeeded, a part of or whole die attachment film 4 may drop off from the die chip 10. Thus, at the time of mounting and bonding the die chip 10 on the lead frame 11, defects may occur. When the formulation amount of the silicone microparticles is too large, the initial adhesive strength decreases. This may result in occurrence of chip flying at the time of dicing or may peel the adhesive sheet 3 from the ring frame 7. The formulation amount of the silicone microparticles may for example, be 0.05, 0.1, 0.5, 1, 5, 10, 50, 100, 150, or 200 parts by mass. This formulation amount may be between any two values exemplified herein.

With regard to the average particle size of the silicone microparticle, a size equal to or less than the thickness of the adhesive layer 1 can be appropriately selected and used Meanwhile, the size is preferably between 0.01 μm and 10 μm. When the average particle size is too small, the dispersion into the adhesive becomes poor. This may result in occurrence of problems with the pick-up efficiency. When the average particle size is too large, the viscosity of the adhesive becomes poor. This may decrease the initial adhesive strength or may induce occurrence of chip flying at the time of dicing. The average particle size of the silicone microparticles may, for example, be 0.01, 0.05, 0.1, 0.5, 1, 1.5, 2, 2.5, 3, 5, or 10 μm. This average particle size may be between any two values exemplified herein. By the way, the term "average particle size" herein means a particle size at 50% of the integrated value in a particle size distribution as determined by a laser diffraction and scattering method.

The silicone microparticles are preferably produced by having silicone rubber spherical microparticles coated with a polyorganosilsesquioxane resin. Such microparticles have better dispersion in the adhesive, and are thus preferably used.

The silicone rubber spherical microparticle is a spherical silicone microparticle having rubber elasticity, and, for example, include a spherical silicone cured material possessing rubber elasticity and having a linear polyorganosiloxane block in its molecular structure, the block represented by the general formula (1):

(wherein R1 is a group selected from one or two or more monovalent organic groups having a carbon number of 1 to 20, the groups selected from alkyls (e.g., methyl, ethyl, propyl, butyl), aryls (e.g., phenyl, tolyl), alkenyls (e.g., vinyl, allyl), aralkyls (e.g., β-phenylethyl, β-phenylpropyl), monovalent halogenated hydrocarbon groups (e.g., chloromethyl, 3,3,3-trifluoropropyl), and organic groups containing a reactive group (e.g., epoxy, amino, mercapto, acryloxy, methacryloxy); 90 mol % or more of R1 is preferably methyl; when "A" is less than 5, features of linear organo polysiloxane are not sufficiently exerted. The maximum value of "A" is not particularly defined. However, in practice, when "A" is larger than 5,000, silicone rubber microparticles is difficult to produce; accordingly, "A" represents the number of between 5 and 5,000, and preferably between 10 and 1,000). This silicone rubber spherical microparticle may contain, in the particle, a silicone oil, organosilane, inorganic powder, organic powder, or the like.

The polyorganosilsesquioxane resin is a resin polymer including, as a structural unit; an organosilsesquioxane unit represented by the general formula (2):

wherein R2 is a group selected from one or two or more monovalent organic groups having a carbon number of 1 to 20, the groups selected from alkyls (e.g., methyl, ethyl, propyl, butyl), aryls (e.g., phenyl, tolyl), alkenyls (e.g., vinyl, allyl), aralkyls (e.g., (β-phenylethyl, β-phenylpropyl), monovalent halogenated hydrocarbon groups (e.g., chloromethyl, 3,3,3-trifluoropropyl), and organic groups containing a reactive group (e.g., epoxy, amino, mercapto, acryloxy, methacryloxy).

In respect to R2 of the polyorganosilsesquioxane resin, 50 mol % or more of R2 is preferably methyl. Also, the resin may contain, in addition to the $R2SiO_{3/2}$ unit, a small amount of an $R2_2SiO_{2/2}$ unit, an $R2_3SiO_{1/2}$ unit, or an $SiO_2$ unit to an extent without impairing its coating characteristic.

The polyorganosilsesquioxane resin has a number average molecular weight (Mn) of preferably between 500 and 10000 without a particular limitation. This is because in such a case the adhesive properties are particularly preferable. This number average molecular weight may, for example, be 500, 1000, 2000, 3000, 4000, 5000, 6000, 7000, 8000, 9000, or 10000. This number average molecular weight may be between any two values exemplified herein.

The entire surface of the silicone rubber spherical microparticle may be uniformly coated or a part of the surface may be coated with the polyorganosilsesquioxane resin. However, when the formulation amount of the polyorganosilsesquioxane resin is less than 1 part by mass per 100 parts by mass of the silicone rubber spherical microparticle, dispersion into the adhesive becomes poor. When the formulation amount of the resin is more than 500 parts by mass, features of the silicone rubber spherical particle are not sufficiently exerted. Thus, the formulation amount of the polyorganosilsesquioxane resin is preferably between 1 part by mass and 500 parts by mass per 100 parts by mass of the silicone rubber spherical microparticles, and more preferably between 5 parts by mass and 100 parts by mass. This formulation amount per 100 parts by mass of the silicone rubber spherical microparticle may, for example, be 1, 5, 10, 20, 50, 100, 150, 200, 250, 300, 350, 400, or 500 parts by mass. This formulation amount may be between any two values exemplified herein.

<1-4. Silicone Graft Polymer>

In order to reduce tight attachment between the die attachment film 4 and the adhesive layer 1 and to enhance the pick-up efficiency, an adhesive of the present invention preferably includes a silicone graft polymer.

Except the point that the silicone graft polymer is produced by polymerizing a monomer having a vinyl group at a silicone molecular chain terminal (hereinafter, referred to as "silicone macromonomer"), examples of the polymer include a homopolymer of a silicone macromonomer and a copolymer of a silicone macromonomer and another vinyl compound. The silicone macromonomer preferably employs a compound having a vinyl group such as a (meth)acryloyl group or styryl group at a silicone molecular chain terminal.

Another vinyl compound is preferably a (meth)acrylate ester monomer that has high compatibility with other polymers formulated in the adhesive. This is because use of those having high compatibility makes the entire adhesive homogenous.

Examples of the (meth)acrylate ester monomer include alkyl(meth)acrylate, hydroxyalkyl (meth)acrylate, denatured hydroxy(meth)acrylate, and (meth)acrylate. In order to prevent occurrence of a residual micro-glue, what is called a "PARTICLE", hydroxyalkyl(meth)acrylate having reactivity or denatured hydroxy(meth)acrylate is preferable.

Examples of the alkyl(meth)acrylate include methyl(meth)acrylate, ethyl(meth)acrylate, n-propyl(meth)acrylate, n-butyl(meth)acrylate, isobutyl(meth)acrylate, t-butyl(meth)acrylate, 2-ethylhexyl(meth)acrylate, lauryl(meth)acrylate, stearyl(meth)acrylate, isobornyl(meth)acrylate, and hydroxyalkyl(meth)acrylate.

Examples of the hydroxyalkyl(meth)acrylate include hydroxyethyl(meth)acrylate, hydroxypropyl(meth)acrylate, and hydroxybutyl(meth)acrylate.

Examples of the denatured hydroxy(meth)acrylate include ethylene oxide denatured hydroxy(meth)acrylate and lactone denatured hydroxy(meth)acrylate.

The silicone graft polymer is preferably a silicone graft polymer produced by polymerizing, in particular, 5 to 95 parts by mass of a silicone macromonomer having a (meth)acryloyl group and 5 to 95 parts by mass of a methyl methacrylate (the sum of the silicone macromonomer and the methyl methacrylate is 100 parts by mass). The polymer has at least one hydroxyl group at a silicone graft polymer terminal and/or side chains thereof by carrying out polymerization using an initiator having a hydroxyl group. This is because the die attachment film is easily peeled from the adhesive sheet, which leads to a better efficiency of picking up the die chip.

The weight average molecular weight (Mw) of the silicone graft polymer is not in particular limited, but is preferably between 1000 and 50 thousand. This is because in such a case the adhesive properties are particularly preferable. This weight average molecular weight may, for example, be 1000, 2000, 3000, 5000, 10 thousand, 20 thousand, 30 thousand, or 50 thousand. This weight average molecular weight may be between any two values exemplified herein.

The formulation amount of the silicone graft polymer is, for example, between 0.01 parts by mass and 15 parts by mass per 100 parts by mass of the (meth)acrylate ester polymer, preferably between 0.05 parts by mass and 12.5 parts by mass, and more preferably between 0.1 parts by mass and 10 parts by mass. When the formulation amount of the silicone graft polymer is too small, the die attachment film 4 is not easily peeled from the adhesive sheet 3 after irradiation with a UV-light and/or radiation. This may lead to occurrence of problems with the efficiency of picking up the die chip 10. In addition, when the formulation is excessive, the initial adhesive strength may decrease, so that peeling from the ring frame 7 may occur during dicing. This formulation amount may, for example, be 0.01, 0.05, 0.1, 0.5, 1, 2, 5, 10, 12.5, or 15 parts by mass per 100 parts by mass of the (meth)acrylate ester polymer. This formulation amount may be between any two values exemplified herein.

<2. Adhesive Sheet>

An adhesive sheet 3 is produced by coating an adhesive on a substrate film 2, and includes the substrate film 2 and an adhesive layer 1 laminated on the layer on the substrate film 2. The adhesive sheet 3 can be used for fixing electronic components at the time of dicing or backgrinding. However, it is preferred that the adhesive sheet 3 is laminated with the DAF 4, and used as a DAF all-in-one adhesive sheet 5 which can be used for both a step of fixing an electronic component in a dicing step and a step of fixing the electronic component onto a lead frame 11.

<2-1. Adhesive Layer>

The adhesive layer 1 has a thickness of preferably 1 µm or more and more preferably 2 µm or more, in particular. In addition, the adhesive layer 1 has a thickness of preferably 100 µm or less and more preferably 40 µm or less, in particular. When the thickness of the adhesive layer 1 is too thin, the adhesive strength may decrease and the chip retention may also decrease at the time of dicing. Together with the above, the peeling between the ring frame 7 and the adhesive sheet 3 may occur. In addition, when the thickness of the adhesive layer 1 is too thick, the adhesive strength may become too high and the pick-up defects may occur.

<2-2. Substrate Film>

A substrate film 2 preferably has a thickness of 30 µm or more. More preferably, in order to prevent the adhesive sheet from being broken at the time of stretching the adhesive sheet during the pick-up step, the substrate film should have a thickness of 60 µm or more. In addition, the thickness of the substrate film 2 is preferably 300 µm or less and more preferably 200 µm or less so as to achieve high stretching ability at the time of stretching the adhesive sheet during the pick-up step.

Examples of a material for the substrate film 2 include polyvinyl chloride, polyethylene terephthalate, an ethylene/vinyl acetate copolymer, an ethylene/acrylate/acrylate ester film, an ethylene/ethyl acrylate copolymer, polyethylene, polypropylene, an ethylene/acrylate copolymer, and an ionomer resin that is produced by cross-linking an ethylene/(meth)acrylate copolymer or an ethylene/(meth)acrylate/(meth)acrylate ester copolymer by using a metal ion. The substrate film 2 can use a mixture, copolymer, or multilayered film of these resins.

Preferably, the material of the substrate film 2 is the ionomer resin. It can prevent occurrence of whisker-like cutting waste to use an ionomer resin which cross-links a copolymer having an ethylene unit, a (meth)acrylate unit, and a (meth)acrylate alkyl ester unit by using a metal ion such as $Na^+$, $K^+$, and $Zn^{2+}$. Accordingly, the above ionomer resin is preferably used among the ionomer resins.

Particularly preferably, the substrate film 2 has a melting flow rate (MFR) of 0.5 to 6.0 g/10 min (JIS K7210, 210° C.) Particularly preferably, the substrate film 2 is a film having a melting point of between 80 and 98° C. and containing a $Zn^{2+}$ ion.

Examples of a procedure for molding the substrate film 2 include calendering molding, T die extrusion, an inflation method, and a casting method.

The substrate film 2 may be coated with an antistatic agent on one surface or both surfaces of the substrate film 2 so as to block electrification at the time of peeling of the DAF 4. Alternatively, the antistatic agent may be made to be kneaded into the resin. Examples of the antistatic agent include a high-molecular-weight antistatic agent, a low-molecular-weight antistatic agent, an electrically conductive polymer, an electrically conductive filler, and a liquid ion.

It is possible to provide, on the side opposite to the adhesive layer 1 of the substrate film 2, an embossed surface having an average surface roughness (Ra) of between 0.3 µm and 1.5 µm. By installing the embossed surface on a machine table side of an expanding apparatus (not shown), the substrate film 2 can be easily extended in an expanding step after dicing.

In order to improve an expanding efficiency after dicing, a lubricant can be coated to the side opposite to the adhesive layer 1 of the substrate film 2, or the lubricant can be mixed in the resin.

The lubricant is not particularly limited if it is a substance capable of decreasing a frictional coefficient between the adhesive sheet 3 and the expanding apparatus (not shown). Examples of the lubricant can include conventionally known substances such as silicone compounds (e.g., a silicone resin, a (denatured) silicone oil), a fluorine resin, hexagonal crystal boron nitride, carbon black, and molybdenum disulfide. With regard to these friction-reducing agents, a plurality of the components may be mixed. Electronic components are manufactured in a clean room, so that it is preferable to use a silicone compound or a fluorine resin.

Examples of a process for producing the adhesive sheet 3 by forming the adhesive layer 1 on the substrate film 2 include a process for directly coating an adhesive on the substrate film 2 by using a coater such as a gravure coater, a comma coater, a bar coater, a knife coater, or a roll coater. The adhesive may be printed on the substrate film 2 by using relief printing, intaglio printing, planography, flexography, offset printing, screen printing, or the like.

<2-3. DAF: Die Attachment Film>

A DAF 4 is a viscous bonding sheet in which an adhesive or bond is molded into a film-like form. The DAF 4 is commercially available in a state in which a bond or adhesive is laminated on a film used for peeling, etc., the film containing a polyethylene terephthalate resin, etc. The DAF 4 can transfer the bond or adhesive onto an adherend.

A material for the DAF 4 may be a component of an adhesive or bond used in general. Examples of the material include epoxy, polyamide, acryl, polyimide, vinyl acetate, an ethylene/vinyl acetate copolymer, an ethylene/acrylate ester copolymer, polyethylene, polysulfone, polyamide acid, silicone, phenol, a rubber polymer, a fluorine rubber polymer and a fluorine resin.

The DAF 4 can use a mixture, copolymer, or laminated body of these components. In the DAF 4, an additive may be blended depending on the need. Examples of the additive include a curing agent, a UV-polymerization initiator, an antistatic agent, a curing accelerator, a silane-coupling agent, a filler, and the like.

<3. Process for Producing Electronic Components>

Next, a process is described which produces electronic components by using the adhesive sheet 3 or the DAF all-in-one adhesive sheet 5. For manufacture of electronic components, herein described are a process using the DAF all-in-one adhesive sheet 5 produced by laminating the DAF4 on the adhesive-coated surface of the adhesive sheet 3, and a process using the adhesive sheet 3 and a paste bond.

<3-1. Process Using DAF All-in-One Adhesive Sheet>

As illustrated in FIGS. 1 to 4, a process for producing electronic components by using a procedure utilizing the DAF all-in-one adhesive sheet 5 includes: a wafer-pasting step of pasting the silicon wafer 6 on a surface of the DAF 4 of the DAF all-in-one adhesive sheet 5; a dicing step of dicing the silicon wafer 6 into the die chips 10 while keeping a state in which the silicon wafer 6 has been pasted on the DAF all-in-one adhesive sheet 5; and a pick-up step of peeling the DAF 4 from the adhesive layer 1 after the dicing step, and picking up the die chip 10 together with the DAF 4. In addition, the process may include a die-chip-mounting step of mounting the picked-up die chip 10 on the lead frame 11 or a circuit board.

Hereinafter, the respective steps are described in detail.

(1) Wafer-Pasting Step

This step carries out fixing by pasting the silicon wafer 6 on a surface of the DAF 4 of the DAF all-in-one adhesive sheet 5. In addition, it is preferable to fix the DAF all-in-one adhesive sheet 5 to the ring frame 7.

(2) Dicing Step

This step dices the silicon wafer 6 into the die chips 10 while keeping a state in which the silicon wafer 6 has been pasted on the DAF all-in-one adhesive sheet 5. The dicing can be carried out by using a dicing blade 8. The adhesive sheet 3 is superior in chip retention before irradiation with a UV-light and/or radiation. Accordingly, peeling of the die chip 10 (i.e., chip flying) can be suppressed at the time of dicing.

(3) Pick-Up Step

This step peels the DAF 4 from the adhesive layer 1 after the dicing step and picks up the die chip 10 including the DAF 4. This step can be carried out specifically by, for example, the following procedure. The DAF all-in-one adhesive sheet 5 is irradiated with a UV-light and/or radiation (not shown) from the substrate film 2 side. Next, the DAF all-in-one adhesive sheet 5 is extended radially to broaden a space between the die chips 10. Then, the die chip 10 is pushed up from below by using a needle (not shown), etc. After that, the die chip 10 is sucked using a vacuum collet or air tweezers (not shown), etc., and peeling is carried out between the DAF 4 and the adhesive layer 1. Finally, the die chip 10 attached to the DAF 4 is picked up. A light source for the UV-light and/or radiation can use one which is publicly known. Examples of the UV-light source include a low-pressure mercury lamp, a high-pressure mercury lamp, an ultrahigh-pressure mercury lamp, and a metal halide lamp. The radiation preferably employs an electron beam, $\alpha$ ray, $\beta$ ray, or $\gamma$ ray.

By being irradiated with a UV-light and/or radiation, vinyl groups within a molecule of a compound included in the adhesive layer 1 can be made to form a three-dimensional network, thereby decreasing the adhesive strength of the adhesive layer 1. Before the irradiation with a UV-light and/or radiation, the above can achieve excellent chip retention because the adhesive layer 1 has a high initial adhesive strength. After the irradiation with a UV-light and/or radiation, the above results in a decrease in the adhesive strength of the adhesive layer 1. Accordingly, peeling between the die attachment film 4 and the adhesive layer 1 becomes easy, which can improve the efficiency of picking up the die chip 10.

(4) Die-Chip-Mounting Step

This step mounts the die chip 10 attached to the DAF 4 on the lead frame 11. Then, the DAF 4 is heated, and the die chip 10 and the lead frame 11 or circuit board is heat-bonded. Finally, the lead frame 11-mounted die chip 10 is made to be molded using a resin (not shown). Instead of the lead frame 11, a circuit board, etc., on which a circuit pattern is formed can be used. Use of the DAF all-in-one adhesive sheet 5 reduces contamination due to a residual micro-glue of the DAF 4. Accordingly, when the die chip 10 attached to the DAF 4 is mounted on the lead frame 11 and is heated to perform bonding, occurrence of poor bonding due to the contamination can be suppressed.

<3-2. Process Using Adhesive Sheet and Paste Bond>

As described by referring to FIGS. 1 to 4, a process for producing electronic components by using a procedure utilizing the adhesive sheet 3 without the DAF includes: a coating step (not shown) of coating a whole backside of the silicon wafer 6 with a paste bond 4; a semi-curing step (not shown) of heating the paste bond 4 and causing the bond to be semi-cured like a sheet to form a bond semi-cured layer 4; a pasting step (FIG. 1) of pasting the bond semi-cured layer 4 of the silicon wafer 6 on the adhesive layer 1 of the adhesive sheet 3; a dicing step (FIG. 2) of dicing the silicon wafer 6 into die chips 10 while keeping a state in which the silicon wafer 6 has been pasted over the adhesive sheet 3; and a pick-up step (FIG. 3) of peeling the bond semi-cured layer 4 from the adhesive layer 1 after the dicing, and picking up the die chip 10 and the bond semi-cured layer 4 attached to a backside of the die chip 10. In addition, the process may include a die-chip-mounting step of mounting the picked-up die chip 10 on the lead frame 11 or a circuit board.

The bond semi-cured layer 4 has a function similar to that of the DAF 4 described above. Accordingly, a configuration similar to FIG. 1 is achieved by pasting the silicon wafer 6 on which the bond semi-cured layer 4 is formed onto the adhesive sheet 3 including the adhesive layer 1 and the substrate film 2 while making a contact between the bond semi-cured layer and the adhesive layer 1. Then, in a manner similar to the case of using the DAF 4, the dicing blade 8 can be used for dicing. After that, the die chip attached to the bond semi-cured layer can be picked up, mounted on the lead frame 11 or a circuit board, and heat-bonded.

The paste bond is heat curable. Except this point, examples of the past bond include one or a mixture selected from acryl, vinyl acetate, an ethylene/vinyl acetate copolymer, an ethylene/acrylate ester copolymer, polyamide, polyethylene, polysulfone, epoxy, polyimide, polyamide acid, silicone, phenol, a rubber polymer, a fluorine rubber polymer, and a fluorine resin.

According to this process, after the silicon wafer 6 is diced, the adhesive sheet 3 is irradiated with a UV-light and/or radiation (not shown) from the substrate film 2 side. Due to this, the die chip 10 can be easily picked up while keeping a state in which the bond semi-cured layer 4 is attached to the backside of the die chip 10. Furthermore, the die chip 10 is mounted and bonded on the lead frame 11, etc., as it is. Moreover, according to this process, contamination of the bond semi-cured layer 4 by the adhesive layer 1 is reduced. Thus, when the die chip 10 attached to the bond semi-cured layer 4 is mounted on the lead frame 11 and is heated to perform bonding, occurrence of poor bonding due to the contamination can be suppressed.

Last, the embodiments of the present invention are mentioned by referring to the Drawings. However, they are just examples of the present invention, and various configurations other than the above can also be adopted.

For example, the silicon wafer 6 may employ a wafer made of another material (e.g., a GaN wafer). Even for the wafer made of another material, the dicing blade 8 suitable for cutting the wafer is used, and the same process for processing a wafer as in the above embodiment can be implemented. In this case, a similar effect can also be accomplished.

EXAMPLES

Hereinafter, the present invention is further described by referring to Examples. First, a material for an adhesive sheet used for experiments is described. Next, a process for producing the adhesive sheet is described. Then, a procedure for assessing the adhesive sheet is described. Finally, the evaluation results are discussed.

<1. Material>

(Meth)acrylate ester polymer: a copolymer containing 54% of ethyl acrylate, 22% of buty acrylate, and 24% of methoxyethyl acrylate, the copolymer being obtained by emulsion polymerization (a polymer product of DENKI KAGAKU KOGYO KABUSHIKI KAISHA). The weight average molecular weight (Mw) is 1.5 million.

Urethane acrylate oligomer A: an oligomer having an acrylate terminal produced by reacting a trimer of hexamethylene diisocyanate (aliphatic diisocyanate) with dipentaerythritol pentaacrylate. The urethane acrylate oligomer has a weight average molecular weight (Mw) of 5000 and has the number of acrylate functional groups of 15 (15 functional groups)(a polymer product of DENKI KAGAKU KOGYO KABUSHIKI KAISHA).

Urethane acrylate oligomer B: an oligomer having an acrylate terminal produced by reacting hexamethylene diisocyanate with a poly(propylene oxide)diol terminal to yield an oligomer having an isocyanate terminal, followed by further reacting the oligomer having an isocyanate terminal with 2-hydroxyethyl acrylate. The number average molecular weight (Mn) is 3,400, and the number of vinyl groups is 2 per molecule (2 functional groups)(a polymer product of DENKI KAGAKU KOGYO KABUSHIKI KAISHA).

Silicone microparticle A: a silicone microparticle produced by coating a silicone rubber spherical microparticle with a polyorganosilsesquioxane resin, the microparticle having an average particle size of 2 μm (Type KMP-605, manufactured by Shin-Etsu Chemical Co., Ltd.).

Silicone microparticle B: a silicone rubber spherical microparticle having an average particle size of 5 μm (Type KMP-597, manufactured by Shin-Etsu Chemical Co., Ltd.)

Silicone microparticle C: a silicone resin microparticle produced from a polyorganosilsesquioxane resin, the microparticle having an average particle size of 2 μm (Type KMP-590, manufactured by Shin-Etsu Chemical Co., Ltd.)

Silicone graft polymer a hydroxyl-group-containing silicone graft polymer produced by polymerizing 30 parts by mass of a silicone macromonomer and 70 parts by mass of methyl methacrylate by using an initiator having 2 hydroxyl groups (a polymer product of DENKI KAGAKU KOGYO KABUSHIKI KAISHA; the weight average molecular weight (Mw): 5000). For the silicone macromonomer, a silicone macromonomer having a methacryloyl group at a silicone molecular chain terminal was used (a polymer product of DENKI KAGAKU KOGYO KABUSHIKI KAISHA; the number average molecular weight (Mn): 1000).

Photopolymerization initiator: benzyl dimethyl ketal (product name: IRGACURE 651, manufactured by Ciba Specialty Chemicals).

Curing agent: a trimethylol propane adduct body containing 1,6-hexamethylene diisocyanate (product name: CORONATE HL, manufactured by NIPPON POLYURETHANE INDUSTRY CO., LTD.).

Substrate film: a $Zn^{2+}$-containing film including an ionomer resin containing a Zn salt of an ethylene/methacrylate/methacrylate alkyl ester copolymer as a chief component, the film having a melting flow rate (MFR) of 1.5 g/10 min (JIS K7210, 210° C.) and a melting point of 96° C. (product name: Himilan 1650, manufactured by DU PONT-MITSUI POLYCHEMICALS CO., LTD.) was used.

Die attachment film: a film having a thickness of 30 μm (a mixture of an epoxy resin and an acrylic resin).

<2. Production of Adhesive Sheet>

In accordance with the components and formulation amounts as shown in Table 1, adhesives corresponding to the respective experiment numbers in Table 1 were prepared. For preparation of the respective adhesives, 3 parts by mass of a photopolymerization initiator and 3 parts by mass of a curing agent, in addition to the components indicated in Table 1, were formulated. In Table 1, the type and formulation amount of the formulated compound was briefly designated. For example, when 100 parts by mass of urethane acrylate oligomer A were formulated, the term "A100" was simply designated in an appropriate space.

Next, the adhesive was coated on a separator film made of polyethylene terephthalate, and the adhesive was spread so as to obtain an adhesive layer 1 having a thickness of 10 μm after drying. Then, the adhesive layer 1 was laminated on the substrate film 2 to yield the adhesive sheet 3. After that, the DAF 4 having a thickness of 30 μm was laminated on the adhesive layer 1 of the adhesive sheet 3 to yield the DAF all-in-one adhesive sheet 5.

<3. Procedure for Assessing Adhesive Sheet>

According to the following procedure, the produced DAF all-in-one adhesive sheet 5 was evaluated.

(1) Wafer-Pasting Step

First, the silicon wafer 6 was pasted on a surface of the DAF 4 of the DAF all-in-one adhesive sheet 5. The silicon wafer 6 has a dummy circuit pattern thereon and has a size of 8-inch diameter×75-μm thickness.

(2) Dicing Step

Next, while keeping a state in which the silicon wafer 6 had been pasted on the DAF all-in-one adhesive sheet 5, the silicon wafer 6 was diced into the die chips 10.

At the time of dicing, the adhesive sheet 3 had a cutting depth of 30 μm. The dicing was carried out to obtain the die chips 10 having a size of 10 mm×10 mm.

DAD341, manufactured by DISCO Corporation, was used for a dicing apparatus. NBC-ZH2050-27HEEE, manufactured by DISCO Corporation, was used for a dicing blade. The dicing conditions were as follows.

The shape of the dicing blade: the external diameter of 55.56 mm, the blade width of 35 μm, the internal diameter of 19.05 mm.

The rotation speed of the dicing blade: 40,000 rpm.
The feed rate of the dicing blade: 80 mm/sec.
The cutting water temperature: 25° C.
The cutting water amount: 1.0 l/min.

(3) Pick-Up Step

Then, after the dicing step, the DAF all-in-one adhesive sheet 5 was irradiated with a UV-light from the substrate film 2 side, and the die chip 10 was picked up together with the DAF 4.

The UV-irradiation was carried out using Type TUV-815US, manufactured by TOYO ADTECS CO., LTD., under conditions at an illuminance of 8 mW/cm and at an irradiance of 500 mJ/cm$^2$.

CAP-300II, manufactured by Canon Machinery Inc., was used as a pick-up apparatus. The pick-up conditions were as follows.

The pin number of the needle: 5 pins.
The pin height of the needle: 0.3 mm.
The expansion length: 5 mm.

(4) Evaluation of adhesive sheet (4-1) Pick-up efficiency

After the silicon wafer 6 was diced in accordance with the above-mentioned conditions, the number of the die chips 10 picked up together with the DAF 4 was determined.

A (Excellent): 95% or more of the die chips 10 were able to be picked up.

B (Good): 80% or more and less than 95% of the die chips 10 were able to be picked up.

C (Not Acceptable): less than 80% of the die chips 10 were able to be picked up.

(4-2) Peeling of Die Attachment Film

The silicon wafer 6 was diced in accordance with the above-mentioned way, and the die chips 10 were picked up. At that occasion, the ratio of dropping (peeling) the die attachment film 4 off the die chip 10 was evaluated as follows.

A (Excellent): the ratio of the drop off area of the die attachment film 4 to the area of the die chip 10 was less than 5%.

B (Good): the ratio of the drop off area of the die attachment film 4 to the area of the die chip 10 was 5% or more and less than 10%.

C (Not Acceptable): the ratio of the drop off area of the die attachment film 4 to the area of the die chip 10 was 10% or more.

TABLE 1

|  |  | 1 | 2 | 3 | 4 | 5 | 6 | 7 | 8 | 9 | 10 |
|---|---|---|---|---|---|---|---|---|---|---|---|
| Adhesive Layer | (Meth)acrylate Ester Copolymer | 100 | 100 | 100 | 100 | 100 | 100 | 100 | 100 | 100 | 100 |
|  | Urethane Acrylate Oligomer | A100 | A100 | A100 | A100 | A100 | A10 | A20 | A200 | A250 | A100 |
|  | Silicone Microparticles | A10 | A0.01 | A0.1 | A100 | A200 | A10 | A10 | A10 | A10 | B10 |
|  | Silicone Graft Polymer | 5 | 5 | 5 | 5 | 5 | 5 | 5 | 5 | 5 | 5 |
| Evaluation | Pick-up Efficiency | A | B | A | A | A | B | A | A | B | A |
|  | Peeling of Die Attachment Film | A | B | A | A | B | B | A | A | A | B |
| Note |  | Ex. | | | | | | | | | |

|  |  | 11 | 12 | 13 | 14 | 15 | 16 | 17 | 18 |
|---|---|---|---|---|---|---|---|---|---|
| Adhesive Layer | (Meth)acrylate Ester Copolymer | 100 | 100 | 100 | 100 | 100 | 100 | 100 | 100 |
|  | Urethane Acrylate Oligomer | A100 | A100 | A100 | A100 | A100 | A100 | B100 | A100 |
|  | Silicone Microparticles | C10 | A10 | A10 | A10 | A10 | A10 | A10 | — |
|  | Silicone Graft Polymer | 5 | — | 0.01 | 0.1 | 10 | 15 | 5 | 5 |
| Evaluation | Pick-up Efficiency | A | B | B | A | A | A | C | B |
|  | Peeling of Die Attachment Film | B | B | B | A | A | B | B | C |
| Note |  | Ex. | | | | | | Comp. Ex. | |

<4. Discussion of Experimental Results>

As demonstrated in the experimental results shown in Table 1, by use of the DAF all-in-one adhesive sheet 5 using the adhesive according to the present invention, it was easy to peel the die attachment film 4 from the adhesive layer 1 at the time of the pick-up operation. In addition, the sheet was able to prevent the die attachment film from dropping off the chip.

The invention claimed is:

1. An adhesive sheet, comprising:
   a substrate film;
   an adhesive layer having an adhesive coated on the substrate film; and
   a die attachment film laminated on the adhesive layer, the adhesive further comprising:
   a (meth)acrylate ester polymer;
   a urethane acrylate oligomer having 4 or more vinyl groups;
   silicone microparticles; and
   a silicone graft polymer, wherein:
   the content of the silicone microparticles is between 0.1 parts by mass and 100 parts by mass per 100 parts by mass of the (meth)acrylate ester polymer,
   the content of the urethane acrylate oligomer is between 20 parts by mass and 200 parts by mass,
   the content of the silicone graft polymer is between 0.05 parts by mass and 12.5 parts by mass per 100 parts by mass of the (meth)acrylate ester polymer, and
   the silicone microparticles are microparticles having silicone rubber spherical microparticles coated with a polyorganosilsesguioxane resin.

2. The adhesive sheet according to claim 1, wherein the sheet is used for fixing an electronic component.

3. A process for producing electronic components, the process comprising:
   a wafer-pasting step of pasting a wafer on a surface of a die attachment film of the adhesive sheet according to claim 1;
   a dicing step of dicing the wafer pasted on the adhesive sheet into die chips; and
   a pick-up step of peeling the die attachment film from the adhesive layer after the dicing step, and picking up the die chip together with the die attachment film.

* * * * *